United States Patent [19]

Larsen

[11] 4,083,037
[45] Apr. 4, 1978

[54] DETECTION CIRCUIT
[75] Inventor: Larry D. Larsen, Palatine, Ill.
[73] Assignee: Patent Development & Management Company, Elgin, Ill.
[21] Appl. No.: 638,843
[22] Filed: Dec. 8, 1975
[51] Int. Cl.[2] .............................................. G08B 17/10
[52] U.S. Cl. ................................ 340/237 S; 250/381; 340/249
[58] Field of Search ............................ 340/237 S, 249; 250/381, 382, 384, 385; 307/130, 252 F, 304, 313, 235 R, 235 A; 328/146–148; 320/48; 324/29.5

[56]  References Cited
U.S. PATENT DOCUMENTS

| 3,505,663 | 4/1970 | Yule | 340/249 X |
| 3,594,751 | 7/1971 | Ogden et al. | 340/249 X |
| 3,603,811 | 9/1971 | Day et al. | 307/304 X |
| 3,718,919 | 2/1973 | Sasaki et al. | 340/237 S |

Primary Examiner—John W. Caldwell, Sr.
Assistant Examiner—Daniel Myer

[57]  ABSTRACT

A battery-powered fire alarm including a smoke detector, a controllable horn circuit and a battery monitoring circuit. The smoke detector employs a pair of complementary field-effect transistor switches with gates respectively connected to an ionization chamber and a potentiometer of a Wheatstone bridge circuit connected across the battery. The field-effect transistors are biased off to minimize standby power consumption and are connected such that the threshold voltages thereof are offsetting to minimize supply voltage sensitivity of the detector. When the voltage from the ionization chamber assumes a value approximately equal to the potentiometer voltage, both field-effect transistors turn on to energize an alarm circuit to sound an alarm. The switching circuit is provided with hysteresis through positive feedback. The battery monitoring circuit employs a pair of complementary field-effect transistors connected with each other to establish a reference voltage to which the battery voltage is compared. The reference voltage is a function of both the threshold characteristics of the field-effect transistors and the magnitude of a preselected control voltage. Both field-effect transistors remain off until a low battery voltage condition is sensed to minimize standby power consumption.

21 Claims, 1 Drawing Figure

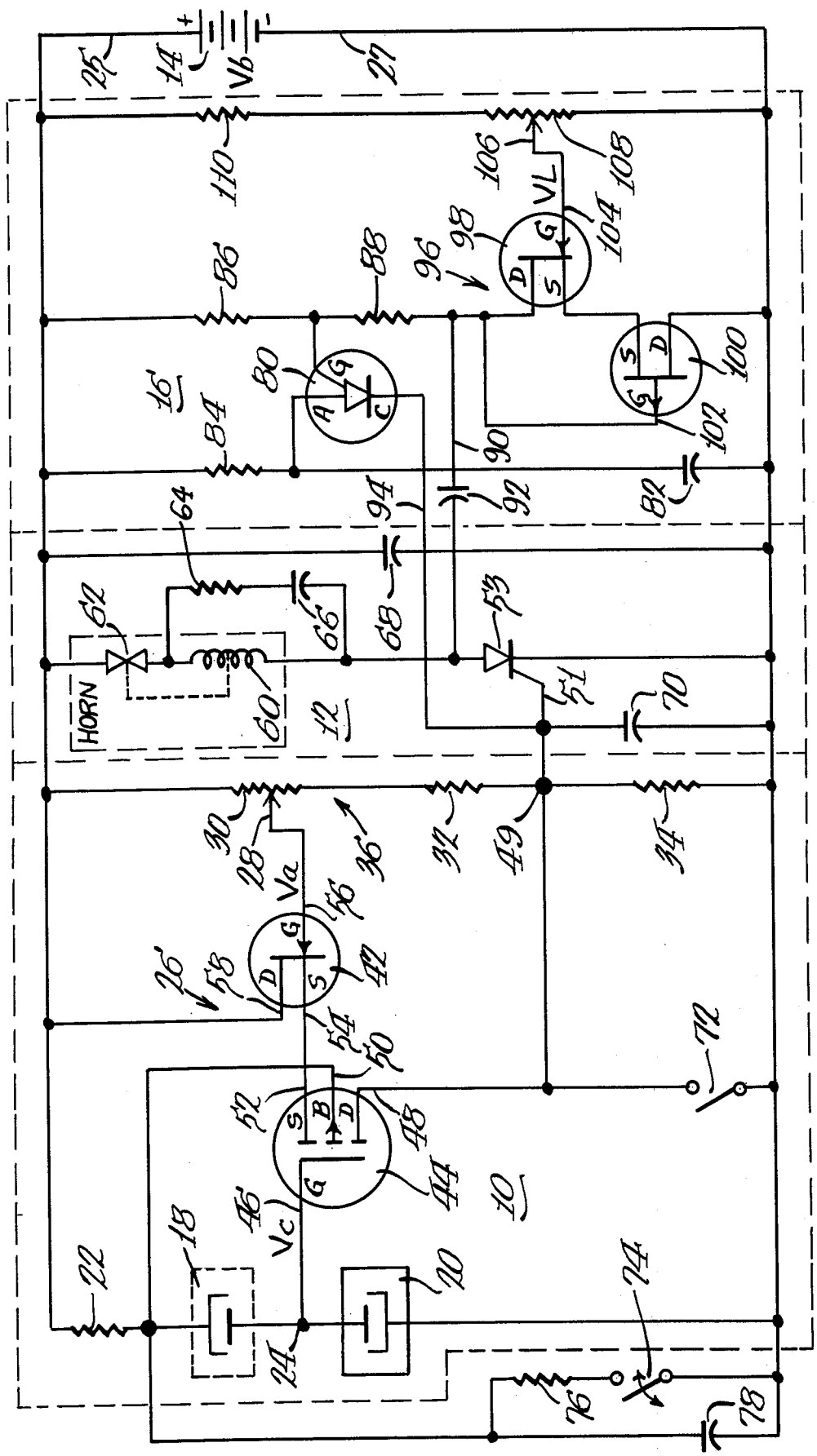

DETECTION CIRCUIT

BACKGROUND OF THE INVENTION

This invention relates to a smoke-detecting fire alarm and, more particularly, to a battery-powered fire alarm of this type and a battery voltage monitoring circuit therefor.

Smoke-sensing fire alarms which sense the change in impedance of an ionization chamber when smoke is introduced thereto are well known. Typically, an open ionization chamber is connected in a voltage divider circuit across a power source and a change in impedance is reflected in a voltage change thereacross. This sensing voltage is monitored by a detection circuit and when it exceeds a preselected alarm level, the detection circuit energizes a suitable alarm circuit. In self-contained, i.e., battery-powered, fire alarms of this type, it is known to provide a battery monitoring circuit which will cause a low battery signal to be generated when the battery has been depleted beneath a level at which successful operation of the alarm circuit is assured.

Known detection circuits have suffered from one or more disadvantageous characteristics. For example, in U.S. Pat. No. 3,688,119 of Kobayashi, issued Aug. 29, 1972, to Nittan Company, Limited, a sensing voltage developed between an open and a closed ionization chamber connected in series across a power supply is applied through an impedance matching field-effect transistor amplifier across a Zener diode. An alarm is sounded when the sensing voltage exceeds the breakover voltage of the Zener diode. Disadvantageously, the field-effect transistor operates in its linear range, and a constant current drain is thereby imposed on the power supply. Stricter tolerance on the Zener diode is required, for an alarm voltage is established solely by the Zener diode breakover characteristic. A further problem is that because the actual alarm voltage applied across the Zener diode is unaltered by supply voltage change while the sensing voltage does change with supply voltage, sensing level stability requires regulation of the power supply.

In U.S. Pat. No. 3,714,641 of Scheidweiler, issued Jan. 30, 1973, to Cerberus AG, an alarm circuit is shown in which the current drain problem is overcome by employing a normally off field-effect transistor which turns on only when a sensing voltage developed across an ionization chamber exceeds its threshold voltage. However, the threshold voltage cannot be adjusted and this again requires strict selection of the field-effect transistors with respect to their threshold voltage characteristics, and means for varying sensitivity are lacking. For the same reasons as in the alarm circuit of Kobayashi noted above, the detection circuit requires a stable or regulated supply voltage for successful operation.

Other circuits which enable use of active elements in the detection circuits thereof of widely varying characteristics, or which was adjustable with respect to sensitivity, lack supply voltage stability and consume an unacceptable amount of standby power.

Known battery monitoring circuits also suffer from the problem that they substantially hasten the depletion of the battery which they monitor. This is due to the fact that most monitoring circuits compare the battery voltage to a reference voltage established by a reverse-biased or forward-biased PN junction which requires a significant amount of current. However, battery monitoring circuits are shown in an article entitled "The Lambda Diode: A Versatile Negative-Resistance Device" by Gota Kano et al, appearing at pages 105–109 in the June 26, 1975, issue of Electronics, which overcome the standby power drain problem. The circuits shown therein employ two junction field-effect transistors connected to form what is termed a lambda diode. The field-effect transistors of the lambda diode both remain off until the battery voltage imposed threreacross decreases below the sum of the respective pinch-off voltages thereof. Unfortunately, the reference voltage is thereby fixed, and may not be adjusted such that, again, strict tolerances on the characteristics of the device are required, which increases the cost of manufacturing a monitoring circuit employing the lambda diode.

SUMMARY OF THE INVENTION

An important object of the present invention is to provide a smoke-sensing fire alarm having a detection circuit which is substantially independent of supply voltage fluctuations. Another object is to provide a smoke-sensing fire alarm having a standby power drain less than that of known fire alarms.

Yet a further object of the present invention is to provide a battery monitoring circuit particularly useful in smoke-sensing fire alarms which assumes virtually no power during standby, but does establish a reference potential that may be selectively varied.

An illustrative embodiment constructed to achieve these objectives employs a pair of complementary field-effect transistors connected across the output of a Wheatstone bridge circuit to compare a sensing voltage at an ionization chamber in one leg thereof with a preselected alarm voltage established by a potentiometer in another leg of the bridge. Both field-effect transistors remain off until the sensing voltage at the ionization chamber is substantially equal to the preselected alarm voltage. Virtually zero power drain is imposed on the battery during standby while supply voltage independence is achieved. The field-effect transistors are connected such that the respective gate-to-source threshold voltages thereof offset one another so that they respond to a substantially zero voltage difference. This occurs when the impedance of the ionization chamber element assumes the alarm condition regardless of changes in supply voltage. When an alarm condition is sensed, both field-effect transistor switches turn on to energize an audible alarm circuit.

A further advantageous feature of the detection circuit is that the output thereof is connected with the input through one leg of the Wheatstone bridge to provide the switch with a hysteresis characteristic tending to keep the field-effect transistors on even after the sensing voltage has returned to a nonalarm condition.

Another important object of the present invention is to provide a battery monitoring circuit of general application and of particular use in a smoke-sensing fire alarm which consumes virtually no power during standby, but which can be adjusted to sense a low battery condition at different voltage levels.

Further features and advantages will be made apparent and the foregoing features and advantages will be described in more detail in the description of the preferred embodiment.

BRIEF DESCRIPTION OF THE DRAWING

The following description of the preferred embodiment is given with reference to the drawing which is a schematic of a smoke-sensing fire alarm constructed in accordance with the present invention.

DESCRIPTION OF THE PREFERRED EMBODIMENT

Referring to the drawing, one embodiment of the smoke-detecting fire alarm of the present invention is seen to include a detection circuit 10, a controllable horn circuit 12 for providing an audible alarm, a battery 14 providing a power supply voltage $V_b$, and a battery monitoring circuit 16. The detection circuit 10, upon sensing a fire alarm condition, causes horn circuit 12 to generate a continuous audible alarm. The battery monitoring circuit 16, upon sensing a fire alarm condition, causes horn circuit 12 to generate a continuous audible alarm. The battery monitoring circuit 16, upon sensing a selected low voltage condition of battery 14, causes the horn circuit 12 to generate an intermittent audible signal.

The detection circuit employs a pair of conventional ionization chambers 18 and 20 connected in series across battery 14 through a resistor 22. Ionization chambers 18 and 20 thus define a voltage divider which produces a sensing voltage $V_c$ at a junction 24 between chambers 18 and 20 which is a function of the relative impedance values thereof. Chamber 20 is closed while chamber 18 is open to ambient air to permit the entry therein of smoke and other gases from a fire.

The entry of smoke into the open chamber 18 causes its impedance to increase while the impedance of the closed chamber 20 is unaffected. The positive terminal 25 of battery 14 is connected to chamber 18 and the negative terminal 27 is connected to chamber 20. Consequently, the fire-induced increase in impedance of open chamber 18 causes the sensing voltage $V_c$ to decrease.

The chambers 18 and 20 are matched with respect to their other characteristics, such as their temperature coefficient, so that other changes in the environment affecting the chambers will produce offsetting changes in the chambers and will not alter the sensing voltage $V_c$. The impedances of both chambers are on the order of hundreds of thousands of megohms so that little drain is imposed on the battery 14 thereby. While different relative impedance values for the ionization chambers will work, relative values which produce, in the absence of smoke, a sensing voltage $V_c$ equal to 0.6 times the battery voltage $V_b$ have been found suitable.

The sensing voltage $V_c$ is compared by a voltage-responsive switching circuit 26 with a preselected alarm voltage $V_a$ developed at the wiper blade output 28 of a potentiometer 30. When the sensing voltage $V_c$ decreases to a value substantially equal to the alarm voltage $V_a$, the switching circuit energizes the horn circuit 12 to sound a continuous alarm.

Potentiometer 30 is connected in series with two fixed resistors 32 and 34 across battery 14 to form a variable voltage divider 36. The voltage divider has a resistance in the megohm range to minimize drain on the battery 14. The variable voltage divider 36, taken with the voltage divider formed by ionization chambers 18 and 20, defines a Wheatstone bridge circuit. Consequently, changes in the sensing voltage $V_c$ due to fluctuations in battery voltage $V_b$ are offset by like changes effected in the alarm voltage $V_a$. This minimizes sensitivity of the switch circuit 26 to fluctuations of battery voltage $V_b$. The fact that the voltage-controlled switch 26 turns on when the bridge is approximately balanced further minimizes supply voltage sensitivity and imposes stability.

The wiper blade output 28 is positioned to establish a value for alarm voltage $V_a$ less than that of the quiescent value of the sensing voltage $V_c$. By varying the position of the wiper blade output 28, the sensitivity may be selectively varied. A value of 0.5 $V_b$ for the alarm voltage $V_a$ has been found suitable when the quiescent value of the sensing voltage $V_c$ is 0.6 $V_b$ for a battery voltage of 9 volts.

Switching circuit 26 comprises an N-channel silicon junction field-effect transistor or J-FET 42 and a P-channel enhancement-type silicon MOS field-effect transistor or MOS FET 44. MOS FET 44 has its gate 46 connected to junction 24. The output of switch 26 is taken from the drain 48 of MOS FET 44 and connected to gate 51 of an SCR 53 of controllable horn circuit 12. The substrate 50 is connected to the positive battery terminal 25 through current limiting resistor 22. The source terminal 52 of MOS FET 44 is connected to the source terminal 54 of J-FET 42. J-FET 42 is in a source follower configuration with its gate 56 connected to the wiper output 28 of variable voltage divider 36 and its drain 58 connected to the positive battery terminal 25.

In keeping with an important aspect of the present invention, both MOS FET 44 and J-FET 42 are biased off to minimize current drain on battery 14, and turn on only when the sensing voltage $V_c$ decreases to a value approximately equal to the alarm voltage $V_a$. When this occurs, both MOS FET 44 and J-FET 42 turn on, and drain current from MOS FET 44 is applied to the gate 51 of SCR 53 which turns on in response thereto.

The MOS FET 44 functions both as a high impedance buffer between the SCR 53 and the sensing circuit of ionization chambers 18 and 20 and as a threshold switching device. The MOS FET 44 turns on when the gate-to-source threshold voltage is exceeded. However, unlike known circuits, the sensing voltage at which this occurs may be selectively varied through control of wiper blade output 28. The position of wiper blade output 28 establishes the voltage at source 52 and thereby the magnitude of the sensing voltage $V_c$ at which the threshold voltage of MOS FET 44 is exceeded. Consequently, MOS FETS with differing threshold characteristics may be used for alarms sounding at the same voltage and the cost of manufacturing reduced.

The high input and low output impedance of the J-FET 42 provides impedance matching between the voltage divider 36 and the MOS FET 44. In addition, the changes in the gate-to-source voltage of $V_{gs}$ of the MOS FET 44 due to temperature changes is offset by changes of opposite sense in the $V_{gs}$ of the J-FET and vice versa.

The complementary arrangement of MOS FET 44 and J-FET 42 also maximizes supply voltage independence of the detection circuit. This is because both MOS FET 44 and J-FET 42 turn on when the bridge is approximately balanced and the point of balance is established solely by the relative impedance values of the legs of the bridge and is completely independent of the supply voltage.

In keeping with another aspect of the invention, the drain 48 of MOS FET 44 is connected with junction 49 of voltage divider 36 to provide hysteresis to switching circuit 26. When MOS FET 44 and J-FET 42 turn on, a relatively low impedance shunt is applied across resistors 30 and 32 such that the alarm voltage $V_a$ at wiper output 28 increases slightly above its value when MOS FET 44 and J-FET 42 are off. Thus, the sensing voltage $V_c$ at junction 24 must increase to a value greater than the value at which MOS FET 44 and J-FET 42 were turned on before they will turn off.

As stated, when drain current is applied to the gate 51 of SCR 53, SCR 53 turns on to energize the horn circuit 12. A filter capacitor 70 is connected between the gate 51 of SCR 53 and its cathode and resistor 34 provides suitable gate bias for SCR 53. Horn circuit 12 is conventional and includes a relay coil 60 connected in series between the anode of SCR 53 and a pair of relay contacts 62 operated thereby. One of contacts 62 is connected with a horn diaphragm (not shown) which vibrates to generate the audible alarm. The horn circuit 12 also includes a series connection of a resistor 64 and capacitor 66 connected across coil 60 and a starting capacitor 68 connected across battery 14.

SCR 53 turns off as soon as contacts 62 open after gate drive to SCR 53 has been removed. Gate drive is removed through closure of normally open switch 72 connected between the gate 51 and the cathode of SCR 53. MOS FET 44 and J-FET 42 will also turn off and remove gate drive when the impedance of chamber 18 returns to a level sufficiently low to decrease the voltages thereacross below pinch-off.

A test circuit is provided by a normally open switch 74 connected through a resistor 76 between negative battery terminal 27 and the junction between resistor 22 and chamber 18. Closure of switch 74 lowers the sensing voltage $V_c$ to a level less than the alarm voltage to simulate an alarm condition.

The battery monitoring circuit 16 includes a conventional relaxation oscillator including a programmable unijunction transistor or PUT 80 which commences oscillating when the voltage across battery 14 decreases below a preselected value established by circuitry associated with a negative resistance switch circuit 96. PUT 80 has its anode connected to a junction between a timing capacitor 82 and resistor 84 connected across battery 14. The gate of PUT 80 is connected through a resistor 86 to the positive side of battery 14 and is also connected through a resistor 88 to switch circuit 96. The output of the oscillator is taken off the cathode of PUT 80 and connected through a lead 94 to SCR gate 51. During oscillation, capacitor 82 is periodically charged through resistor 84 and discharged through PUT 80 into gate 51 to turn on SCR 53 and momentarily energize the coil 60. The reduction of voltage across capacitor 82 at the end of the discharge cycle causes PUT 80 to turn off at the end of discharge.

The value of capacitor 82 is selected so that the coil is momentarily energized at frequencies of approximately once per minute. The battery voltage level at which the relaxation oscillator is enabled to oscillate is selected so that sufficient power is available to operate the oscillator for at least seven days.

An advantageous feature of the present invention is that if the battery should become disconnected, the starting capacitor will provide enough power to energize the horn circuit 12 for one cycle of the resonant oscillator when a low battery condition is sensed by circuit 96. Accordingly, both no battery and low battery indications are provided. This feature can, of course, also be advantageously employed with a circuit powered by A.C.

The switch circuit 96 is connected between the negative side of battery 14 and the junction between resistor 88 and capacitor 92. The oscillator circuit is enabled to oscillate only when switch circuit 96 assumes a conductive state. The switch circuit 96 comprises a pair of complementary, depletion mode, field-effect transistors: and N-channel J-FET 98 and a P-channel J-FET 100. The drain-source circuit of the J-FETS 98 and 100 are connected in series with each other between the negative battery terminal 27 and the gate input of the relaxation oscillator. The gate 102 of J-FET 100 is connected to the junction between resistor 88 and the drain 103 of J-FET 98. The gate 104 of J-FET 98 receives a control voltage VL at a wiper output 106 of a potentiometer 108 connected across battery 14 through a fixed resistor 110. Gate 104 of J-FET 98 is thus connected to a potential higher than that applied to its source terminal.

Both J-FETS 98 and 100 remain off until the voltage thereacross, i.e., the battery voltage $V_b$, decreases to a value less than a preselected low battery voltage VL established by the variable control VL at the wiper blade output 106 and the threshold voltages of J-FETS 98 and 100. This low battery voltage is approximately equal to the sum of the threshold voltages of J-FETS 98 and 100 and the control voltage VL. Until this preselected low battery voltage is reached, the only current through circuit 96 is leakage current in the nanno ampere range. When the battery voltage $V_b$ across switch 96 decreases below the preselected low battery voltage VL, the current therethrough increases rapidly with small decreases in the voltage thereacross until a peak current having a corresponding peak voltage is reached. For values of voltage less than the peak voltage, the switch circuit has a positive resistance current and decreases in voltage result in a decrease of current.

The switch 96 functions in a manner similar to that of a lambda diode, as described in the aforementioned article entitled "The Lambda Diode: A Versatile Negative-Resistance Device," and reference may be had thereto for a schematic illustration of the current-voltage characteristic curve. In the lambda diode, however, the voltage $V_v$ corresponding to the low battery voltage of circuit 96 is solely dictated by the threshold characteristic of the field-effect transistors. The versatility of the switching circuit 96, in which the low battery voltage $V_v$ is a function of the position of wiper blade 106, is not achieved.

When switching circuit 96 turns on, the voltage thereacross drops to a level beneath its peak voltage. A capacitor 92 connected between the anode of SCR 53 and the junction of the drain of J-FET 98 with resistor 88 provides a positive voltage feedback pulse from SCR 53 when it turns off to assist in resetting switch circuit 96 to its condition in which the voltage across switch circuit 96 is greater than the peak voltage.

The particular operating characteristics of a circuit constructed in accordance with the present invention is of course dependent upon the particular characteristics and values of the various components which are used. Thus, while other components could be successfully employed, a circuit built in accordance with the schematic of the drawing and using the below-identified chart elements has been found to operate in a suitable manner:

| Ref. No. | Description | Characteristic | Trade Designation |
|---|---|---|---|
| 14 | battery | Alkaline 9v | |
| 18 | ionization chamber | $300 \times 10^{+15}$ ohms | |
| 20 | ionization chamber | $300 \times 10^{+15}$ ohms | |

-continued

| Ref. No. | Description | Characteristic | Trade Designation |
|---|---|---|---|
| 22 | resistor | 100 Kohm | |
| 30 | potentiometer | 1 Mohm | |
| 32 | fixed resistor | 1 Mohm | |
| 34 | fixed resistor | 5.1Kohm | |
| 42 | J-FET | | Siliconix Inc. E211 |
| 44 | MOS FET | | General Instrument Inc. — 3N163 |
| 53 | SCR | | General Electric C106 |
| 60 | coil | 9 volt Kobishi | |
| 64 | resistor | 100 ohms | |
| 66 | capacitor | .1 microfarad | |
| 68 | starting capacitor | 330 microfarad | |
| 70 | capacitor | .01 microfarad | |
| 76 | resistor | 470Kohm | |
| 78 | filter capacitor | .01 microfarad | |
| 80 | PUT | | Nippon Electric N13T2 |
| 82 | timing capacitor | 15 microfarad | |
| 84 | resistor | 4Mohm | |
| 86 | resistor | 100Kohm | |
| 88 | resistor | 220Kohm | |
| 92 | capacitor | .01 microfarad | |
| 98 | J-FET | | Siliconix Inc. E211 |
| 100 | J-FET | | Siliconix Inc. E270 |
| 108 | potentiometer | 1Mohm | |
| 110 | fixed resistor | 1Mohm | |

Because of the various advantageous features of the present invention set forth above, the total battery current in standby is less than 10 microamperes and the circuit will successfully operate for one year on a single battery of the above-identified type before a low battery indication is provided.

I claim:

1. In a circuit having a source of power, a voltage divider connected across the power source having an output and a sensing element with an impedance variable in accordance with a phenomenon sensed thereby, variation of said impedance causing a corresponding variation in a sensing voltage at said output, a detection circuit, comprising:

a pair of complementary voltage-responsive switches each having a pair of transconductive terminals and a control terminal and being switchable between conductive and nonconductive states;

means for connecting the transconductive terminals in series across the power source;

means for applying a preselected detection voltage to the control input of one of said switches, said preselected voltage being proportional to the power source voltage;

means for applying the sensing voltage to the control input of the other of said pair of complementary switches, both of said switches being biased in a nonconductive state and both of said switches assuming a conductive state when the sensing voltage value assumes a value substantially equal to said preselected detection voltage; and means responsive to said switches assuming a conductive state for providing an indication of detection.

2. The circuit of claim 1 in which
said sensing element is an ionization chamber having an impedance which varies in response to the introduction thereto of smoke-like gases and
said indication providing means includes means for generating an audible alarm in response to said pair of switches assuming conductive states.

3. The circuit of claim 1 wherein said pair of complementary voltage-responsive switches comprise an N-channel field-effect transistor and a P-channel field-effect transistor.

4. The circuit of claim 3 in which one of said field-effect transistors is a metal oxide field-effect transistor.

5. The circuit of claim 4 in which the other one of said field-effect transistors is a junction field-effect transistor.

6. The circuit of claim 1 including means connected between one of the transconductive terminals of said other switch and the control input of said one switch for establishing a hysteresis for said switches.

7. The circuit of claim 6 in which
the detection voltage applying means includes a voltage divider circuit having an intermediate point therein, and
said hysteresis establishing means comprises means responsive to said switches assuming a conductive state for applying a feedback signal to said intermediate point.

8. The circuit of claim 7 in which said voltage divider circuit is connected across said power source and the application of the feedback signal to the intermediate point increases the detection voltage.

9. The circuit of claim 6 in which
said indication providing means includes an electronic switching element and
means for generating an alarm signal in response to said electronic switching element assuming a conductive state, means connected with said pair of complementary switches for applying an input signal to said electronic switching element to cause it to assume said conductive state, said electronic switching element reverting to a nonconductive state to terminate generation of said alarm in response to termination of said input signal.

10. The circuit of claim 1 in which
said indicating means includes means responsive to said switches assuming a conductive state to generate a continuous alarm, and
including
means for establishing a preselected low battery voltage, and
means responsive to the battery voltage decreasing below said preselected value to cause said alarm generating means to intermittently generate an alarm.

11. The circuit of claim 1 including means for selectively varying the magnitude of said preselected detection voltage.

12. A circuit for monitoring a source of voltage comprising:

a pair of complementary voltage-responsive amplifiers having a pair of transconductive terminals and a control terminal and switchable from nonconductive and conductive states in response to voltages applied between one of the transconductive terminals and the control terminal exceeding a turn-on voltage characteristic thereof;

means for connecting the transconductive terminals of the pair of amplifiers in series with one another across the voltage source being monitored;

means for coupling the control input of one of said voltage-responsive amplifiers to one of the transconductive terminals of the other amplifier connected with the voltage source;

means for developing a preselected non-zero reference voltage; and means for applying the reference voltage to the control input of the other of said pair of voltage-responsive amplifiers, said voltage-responsive amplifiers remaining in a nonconductive state until the source voltage applied across the series connection thereof decreases below the sum of the respective turn-on voltages thereof and the preselected reference voltage.

13. The circuit of claim 12 in which said source of voltage is a battery.

14. The circuit of claim 13 wherein said pair of complementary voltage-responsive amplifiers comprise a pair of complementary field-effect transistors and said turn-on voltages thereof comprise their respective gate source threshold voltages.

15. The circuit of claim 12 wherein said reference voltage developing means comprises a voltage divider connected across said source of voltage.

16. The circuit of claim 15 wherein said voltage divider includes a variable potentiometer having an output and said reference voltage is developed at said output.

17. The circuit of claim 15 in which said reference voltage developing means includes means for selectively varying the reference voltage.

18. The circuit of claim 12 in which said source of voltage is a battery having a positive terminal and a negative terminal, and said pair of complementary voltage-responsive amplifiers comprise an N-channel field-effect transistor and a P-channel field-effect transistor, each having a gate comprising the control input and a drain and source comprising said pair of transconductive terminals, and said conducting means includes means for coupling the source terminals of the two field-effect transistors, means for connecting the drain terminal of the N-channel field-effect transistor to the positive side of the battery, and means for connecting the drain terminal of the P-channel field-effect transistor to the negative side of the battery, and said control input coupling means comprises means for connecting the gate terminal of the P-channel of the field-effect transistor to the drain terminal of the N-channel field-effect transistor.

19. The circuit of claim 12 in which said pair of complementary voltage-responsive amplifiers are characterized by a voltage versus current curve having a positive resistance slope between zero voltage and a peak voltage, and a negative resistance slope between the peak voltage and the sum of the respective turn-on voltages thereof and the preselected control voltage, said pair of amplifiers upon assuming a conductive state decreasing the voltage thereacross to a value less than said peak voltage, and including means other than said reference voltage applying means for applying a positive voltage across said amplifier to increase the total voltage thereacross to a value greater than said peak voltage to assist in resetting the amplifiers to their nonconductive condition.

20. The circuit of claim 19 wherein said resetting means includes a capacitor connected between one side of the source of voltage and one of the transconductive terminals of said pair of complementary amplifiers.

21. The circuit of claim 20 including a semiconductor switch connected to said capacitor and responsive to said pair of amplifiers assuming a conductive state to turn on to discharge said capacitor, and means for turning off said semiconductor switch, said capacitor coupling a positive pulse from said supply voltage to said one transconductive input in response to turn-off of the semiconductor switch.

* * * * *

UNITED STATES PATENT AND TRADEMARK OFFICE
CERTIFICATE OF CORRECTION

PATENT NO. : 4,083,037
DATED : Apr. 4, 1978
INVENTOR(S) : Larry D. Larsen

It is certified that error appears in the above-identified patent and that said Letters Patent are hereby corrected as shown below:

At column 1, line 59, delete "was" and insert --are--. At column 2, line 9, delete "threreacross" and insert --thereacross--; and at column 2, lines 24-28, inclusive, cancel the sentence beginning with "Yet a further object--". At column 4, line 51, delete "of" and insert --or--. At column 6, line 5, delete the first word "and" and insert --an--; at column 6, line 19, after the word "control" insert --voltage--; at column 8, line 11, after "switches" insert --.--.

Signed and Sealed this

Twelfth Day of September 1978

[SEAL]

Attest:

RUTH C. MASON
*Attesting Officer*

DONALD W. BANNER
*Commissioner of Patents and Trademarks*